(12) United States Patent
Su et al.

(10) Patent No.: US 12,078,551 B2
(45) Date of Patent: Sep. 3, 2024

(54) COMPLEMENTARY BIPOLAR JUNCTION TRANSISTOR

(71) Applicant: Taiwan Semiconductor Manufacturing Company, Ltd., Hsinchu (TW)

(72) Inventors: Zi-Ang Su, Taoyuan County (TW); Ming-Shuan Li, Hsinchu County (TW); Shu-Hua Wu, Hsinchu (TW); Chih Chieh Yeh, Taipei (TW); Chih-Hung Wang, Hsinchu (TW); Wen-Hsing Hsieh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 996 days.

(21) Appl. No.: 17/069,596

(22) Filed: Oct. 13, 2020

(65) Prior Publication Data

US 2022/0113199 A1    Apr. 14, 2022

(51) Int. Cl.
| | |
|---|---|
| *G01K 7/01* | (2006.01) |
| *H01L 21/02* | (2006.01) |
| *H01L 21/265* | (2006.01) |
| *H01L 21/8228* | (2006.01) |
| *H01L 27/082* | (2006.01) |

(Continued)

(52) U.S. Cl.
CPC ........ *G01K 7/015* (2013.01); *H01L 21/02532* (2013.01); *H01L 21/02603* (2013.01); *H01L 21/26513* (2013.01); *H01L 21/82285* (2013.01); *H01L 27/0826* (2013.01); *H01L 29/0673* (2013.01); *H01L 29/165* (2013.01); *H01L 29/66242* (2013.01); *H01L 29/7371* (2013.01)

(58) Field of Classification Search
None
See application file for complete search history.

(56) References Cited

U.S. PATENT DOCUMENTS

| 9,818,872 B2 | 11/2017 | Ching et al. |
| 9,887,269 B2 | 2/2018 | Ching et al. |

(Continued)

OTHER PUBLICATIONS

Huang, Yu-Xuan et al, "Backside PN Junction Diode", U.S. Appl. No. 16/901,816, filed Jun. 15, 2020, Assignee: Taiwan Semiconductor Manufacturing Co., Ltd., 26 pages specificaiton, 17 pages drawings.

*Primary Examiner* — Erica S Lin
(74) *Attorney, Agent, or Firm* — HAYNES AND BOONE, LLP

(57) ABSTRACT

The present disclosure provides embodiments of semiconductor devices. In one embodiment, the semiconductor device includes a dielectric layer and a fin-shaped structure disposed over the dielectric layer. The fin-shaped structure includes a first p-type doped region, a second p-type doped region, and a third p-type doped region, and a first n-type doped region, a second n-type doped region, and a third n-type doped region interleaving the first p-type doped region, the second p-type doped region, and the third p-type doped region. The first p-type doped region, the third p-type doped region and the third n-type doped region are electrically coupled to a first potential. The second p-type doped region, the first n-type doped region and the second n-type doped region are electrically coupled to a second potential different from the first potential.

20 Claims, 9 Drawing Sheets

(51) Int. Cl.
  *H01L 29/06* (2006.01)
  *H01L 29/165* (2006.01)
  *H01L 29/66* (2006.01)
  *H01L 29/737* (2006.01)

(56) References Cited

U.S. PATENT DOCUMENTS

| | | |
|---|---|---|
| 9,899,398 B1 | 2/2018 | Colinge et al. |
| 10,032,627 B2 | 7/2018 | Lee et al. |
| 10,109,721 B2 | 10/2018 | Lin et al. |
| 10,157,799 B2 | 12/2018 | Ching et al. |
| 10,199,502 B2 | 2/2019 | Huang et al. |
| 10,290,546 B2 | 5/2019 | Chiang et al. |
| 10,475,902 B2 | 11/2019 | Lee et al. |
| 2015/0048486 A1* | 2/2015 | Shih ............... H01L 21/02532 438/700 |
| 2017/0005195 A1* | 1/2017 | Ching ............... H01L 29/66795 |
| 2018/0175036 A1 | 6/2018 | Ching et al. |

* cited by examiner

COMPLEMENTARY BIPOLAR JUNCTION TRANSISTOR

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Multi-bridge-channel (MBC) transistors have been introduced in an effort to improve gate control by increasing gate-channel coupling, reduce OFF-state current, and reduce short-channel effects (SCEs). Because a gate structure of an MBC transistor wraps around a channel or a channel member and a channel member of an MBC transistor may resemble nanowires or nanosheets, an MBC transistor may also be referred to as a gate-all-around (GAA) transistor, a surrounding gate transistor (SGT), a nanowire transistor, a nanosheet transistor, or a nanostructure transistor.

The high device packing density brought about by MBC transistors or other multi-gate transistors may introduce heat that may cause performance deterioration. To monitor and control heat generation, thermal sensors may be needed. Conventional thermal sensors may require additional process steps and may not be placed sufficiently adjacent to the hot spots in an IC device. Therefore, although conventional thermal sensors are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
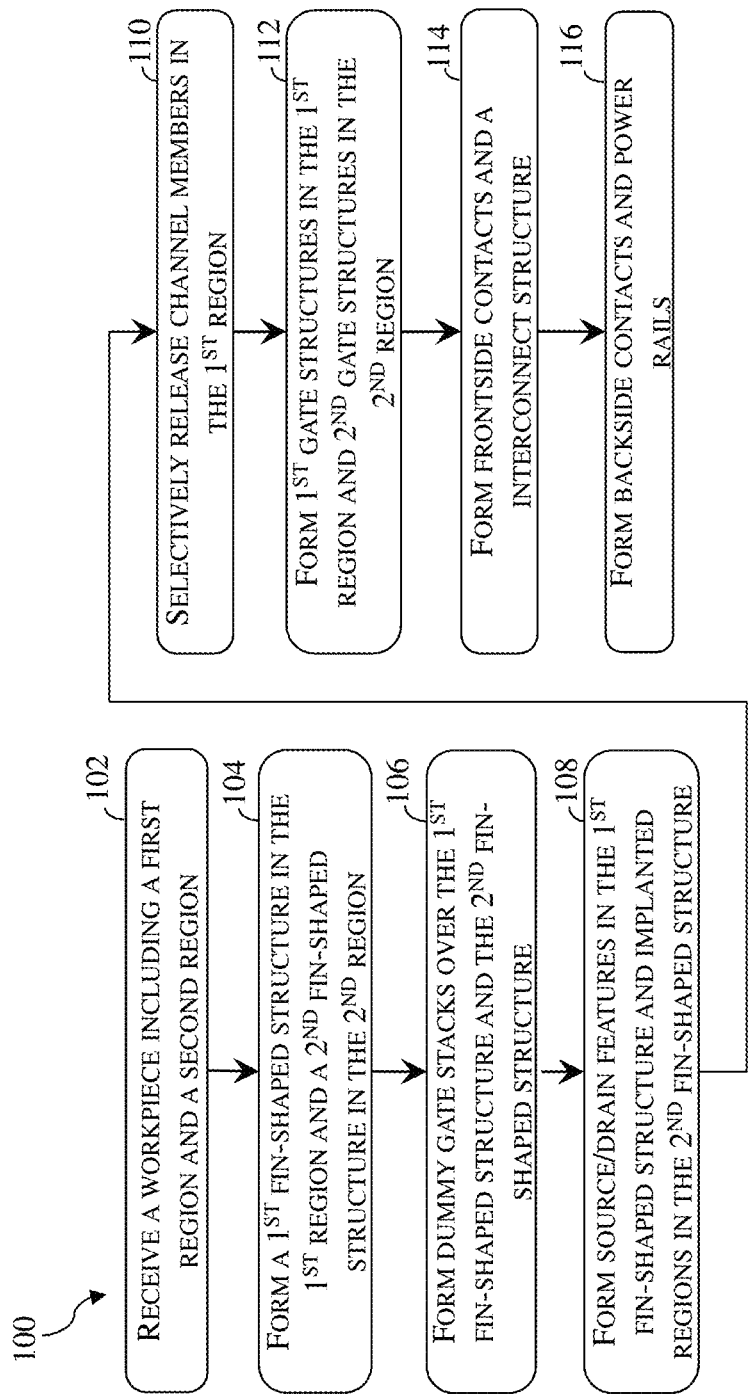
FIG. 1 is a flow chart of a method for fabricating semiconductor structures on a workpiece, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure generally relates to bipolar junction transistors (BJTs). Particularly, the present disclosure relates to complementary BJTs that are fabricated along with MBC transistors to serve as thermal sensors.

The high device packing density brought about by advanced multi-gate transistors, such as MBC transistors, may introduce heat that may not be easily dissipated. Accumulation of heat in the IC devices may cause performance deterioration. While thermal sensors may be fabricated at the back-end-of-line (BEOL) level or integrated with the IC package, they require additional fabrication processes. Additionally, because these conventional thermal sensors are not fabricated at the front-end-of-line (FEOL) level along with the active components, they may not be sufficiently close to the heat source and their measurements may not sufficiently reflect the thermal loading at hot spots in the IC device.

The present disclosure provides a revolutionary thermal sensor that is fabricated along with the MBC transistors using similar fabrication processes. The thermal sensor of the present disclosure includes a unique complementary bipolar junction transistor (CBJT) structure, which includes a PNP BJT and an NPN BJT. The base and collector of the PNP BJT and the emitter of the NPN BJT are coupled to a first potential. The emitter of the PNP BJT and the base and collect collector of the NPN BJT are coupled to a second potential. The emitters, bases, and collectors of the CBJT are formed by implanting dopants into fin-shaped structure. The voltage difference between the first potential and the second potential correlates to change of temperature and allows the thermal sensor of the present disclosure to sense temperature. The complementary nature of the CBJT cancels out uneven concentration distribution of n-type and p-type dopants and allows the thermal sensor of the present disclosure to provide accurate thermal measurements.

Figure 6:
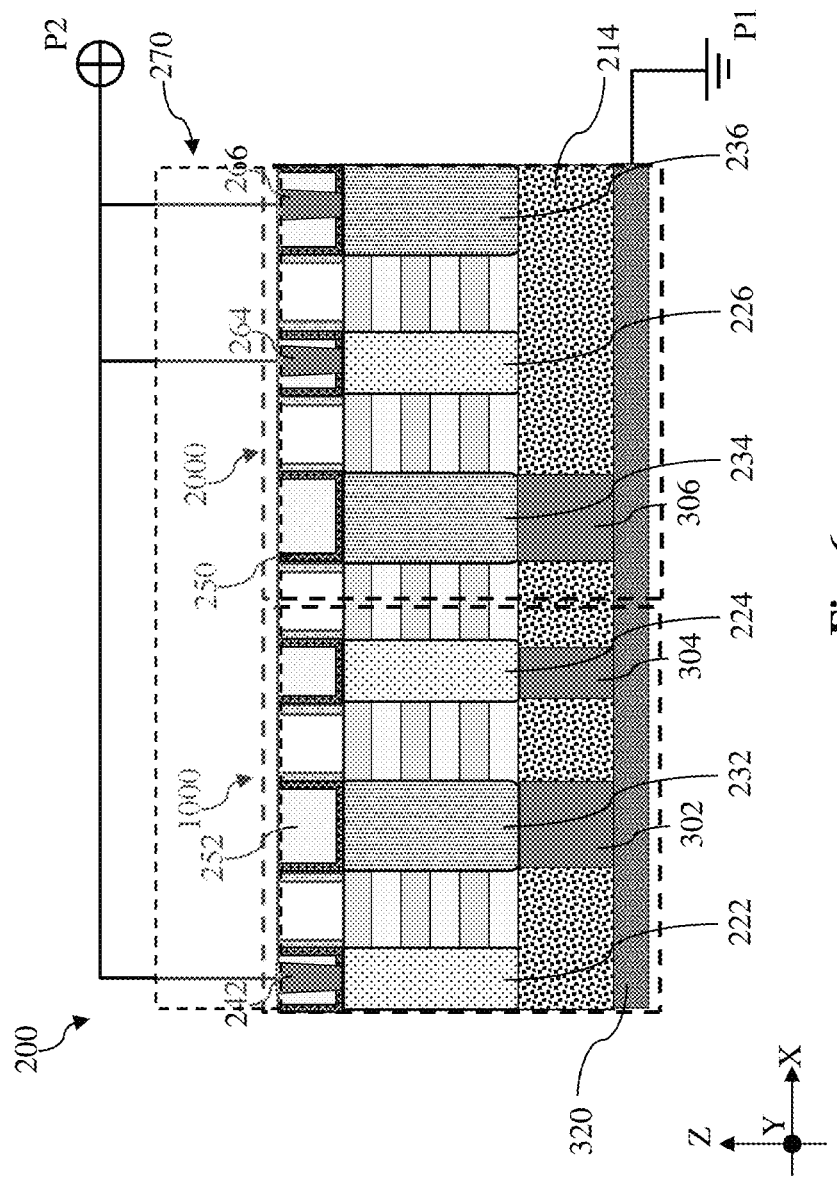
Figure 7:
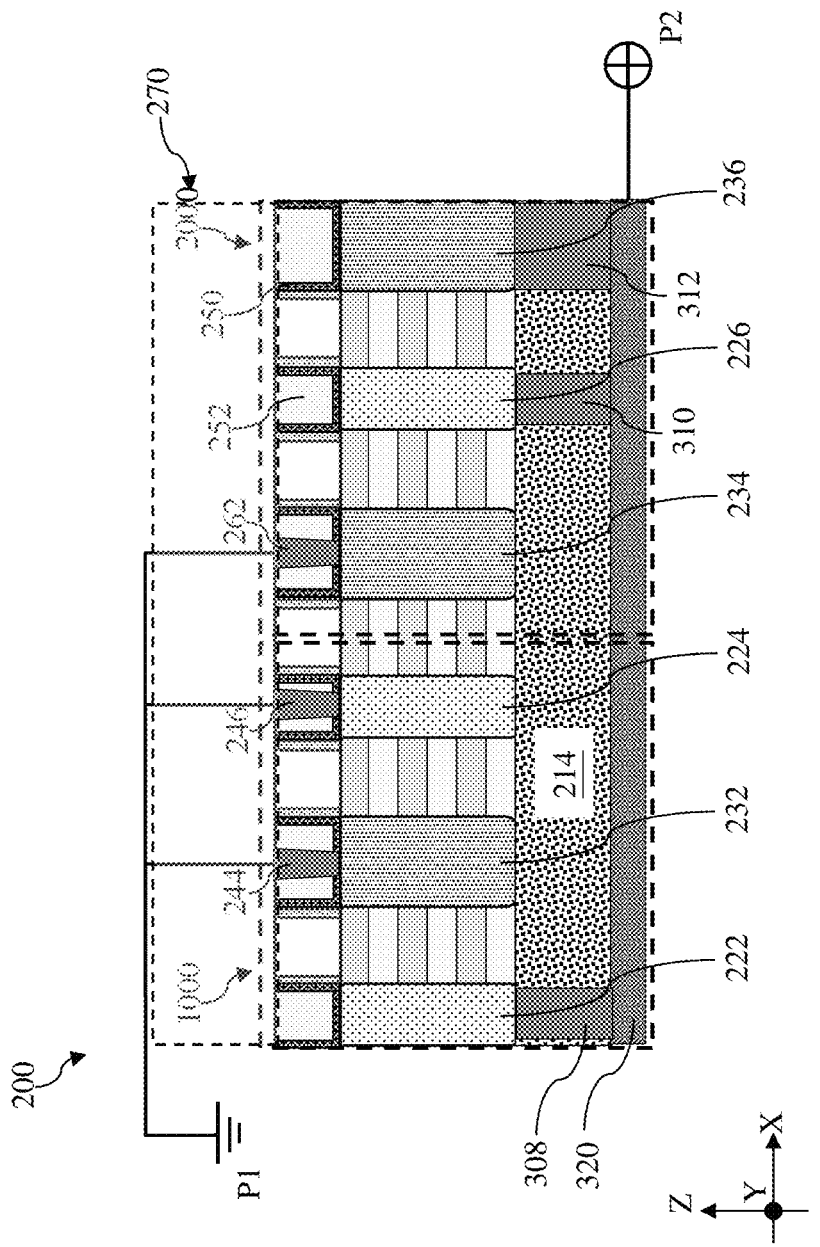
Figure 8:
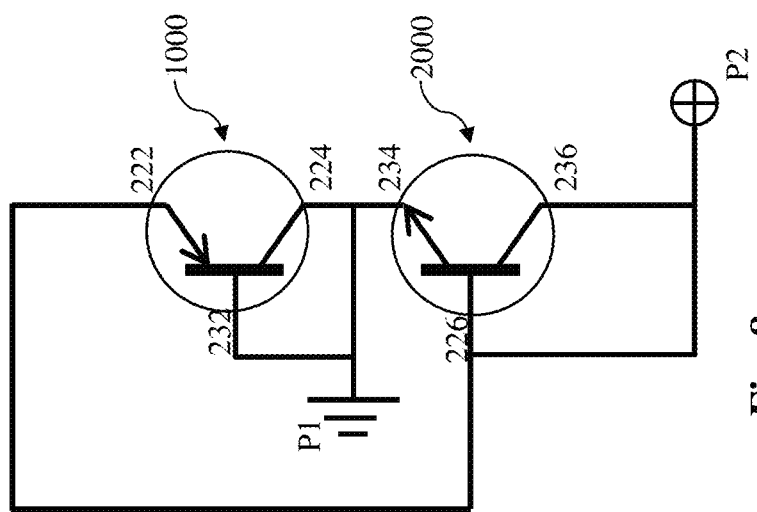
FIG. 8 illustrates an equivalent circuit diagram of the semiconductor devices, according to various aspects of the present disclosure.
Figure 9:
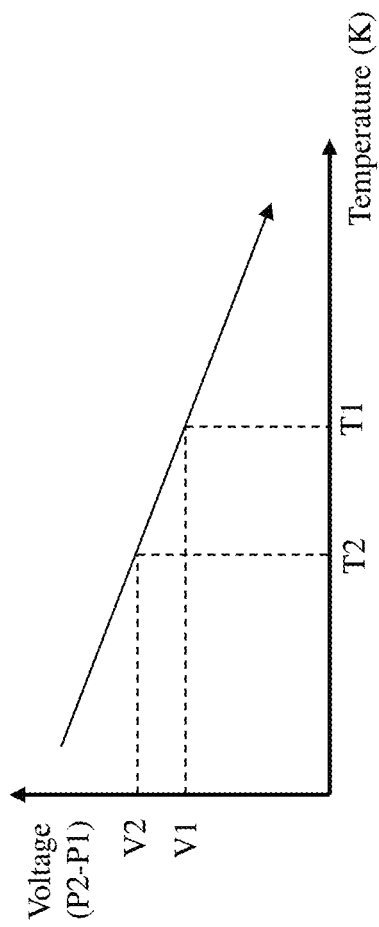
FIG. 9 is a characteristic voltage-temperature curve of semiconductor devices according to various aspects of the present disclosure.

The various aspects of the present disclosure will now be described in more detail with reference to the figures. In that regard, FIG. 1 is a flowchart illustrating method 100 of forming semiconductor structures in a first region and a second region of a workpiece 10. Method 100 is merely an example and is not intended to limit the present disclosure to what is explicitly illustrated in method 100. Additional steps may be provided before, during and after the method 100, and some steps described can be replaced, eliminated, or moved around for additional embodiments of the method. Not all steps are described herein in detail for reasons of simplicity. The workpiece 10 is representatively illustrated in FIG. 2. FIGS. 3-7 illustrate fragmentary top view and cross-sectional views of a semiconductor device 200 fabricated in a second region of the workpiece 10, according to method 100 illustrated in FIG. 1. FIG. 8 illustrates a representative equivalent circuit of the semiconductor device 200 shown in FIGS. 3-7. FIG. 9 illustrates a representative voltage-temperature characteristic curve of the semiconductor device 200 shown in FIGS. 3-7.

Figure 2:
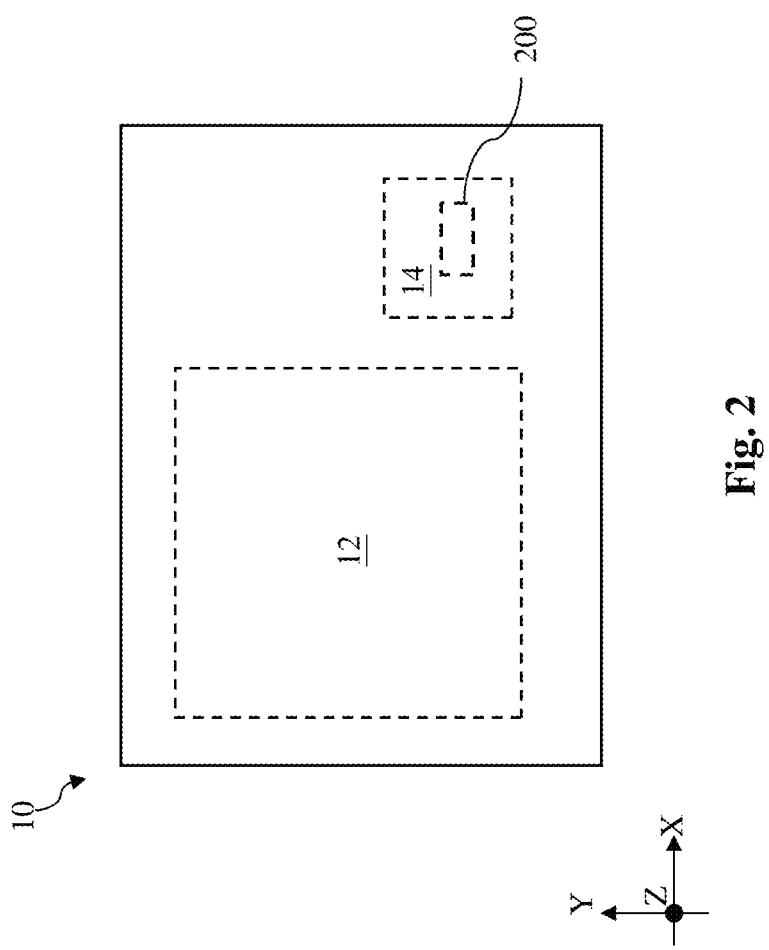
FIG. 2 illustrates a fragmentary top view of a workpiece having a first region and a second region, according to various aspects of the present disclosure.

Referring to FIGS. 1 and 2, method 100 includes a block 102 where a workpiece 10 is received. As shown in FIG. 2, the workpiece 10 includes a first region 12 and a second region 14. In some embodiments, the first region 12 is a logic device region where MBC transistors reside and the second region 14 is a thermal sensor region where thermal sensors are being fabricated. It can therefore be seen that the thermal sensor according to the present disclosure are fabricated simultaneously on the same surface of the workpiece 10. As will be described below, fabrication of the thermal sensors of the present disclosure share many process steps for forming the MBC transistors in the first region 12. Because thermal sensors in the second region 14 are configured to measure or sense temperature in the first region 12, an area of the second region 14 is smaller than an area of the first region 12, as representatively shown in FIG. 2.

Referring to FIG. 1, method 100 includes a block 104 where a first fin-shaped structure is formed in the first region 12 and a second fin-shaped structure is formed in the second region 14. The workpiece 10 may include a substrate and a stack deposited on the substrate. The substrate may be a silicon (Si) substrate. In some alternative embodiments, the substrate may include germanium (Ge) or other suitable semiconductor materials. The stack includes alternating layers of two different semiconductor materials. In some embodiments, the stack may include a plurality of silicon (Si) layers that are interleaved by a plurality of silicon germanium (SiGe) layers. The different semiconductor compositions allow selective removal of one of the alternating layers to release the other of the alternating layers as channel members. For example, when the stack includes silicon layers interleaved by silicon germanium layers, the germanium composition in the silicon germanium layers allow the silicon germanium layers to be selectively removed. For this reason, the silicon layers may be referred to as channel layers while the silicon germanium layers may be referred to as sacrificial layers. Using photolithography and etching processes, the substrate and the stack deposited thereon are patterned at block 104 to form the first fin-shaped structure in the first region 12 and the second fin-shaped structure in the second region 14.

Figure 3:
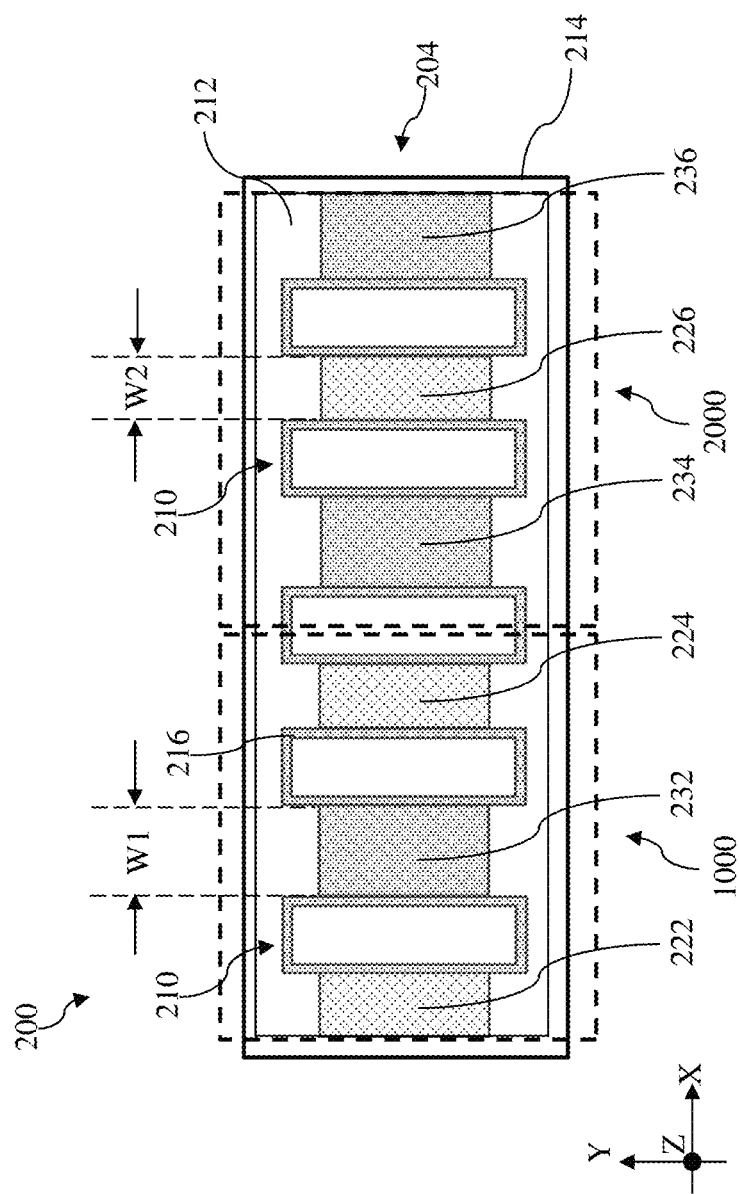
FIG. 3 illustrates a fragmentary top view of a semiconductor device in the second region, according to various aspects of the present disclosure.
Figure 4:
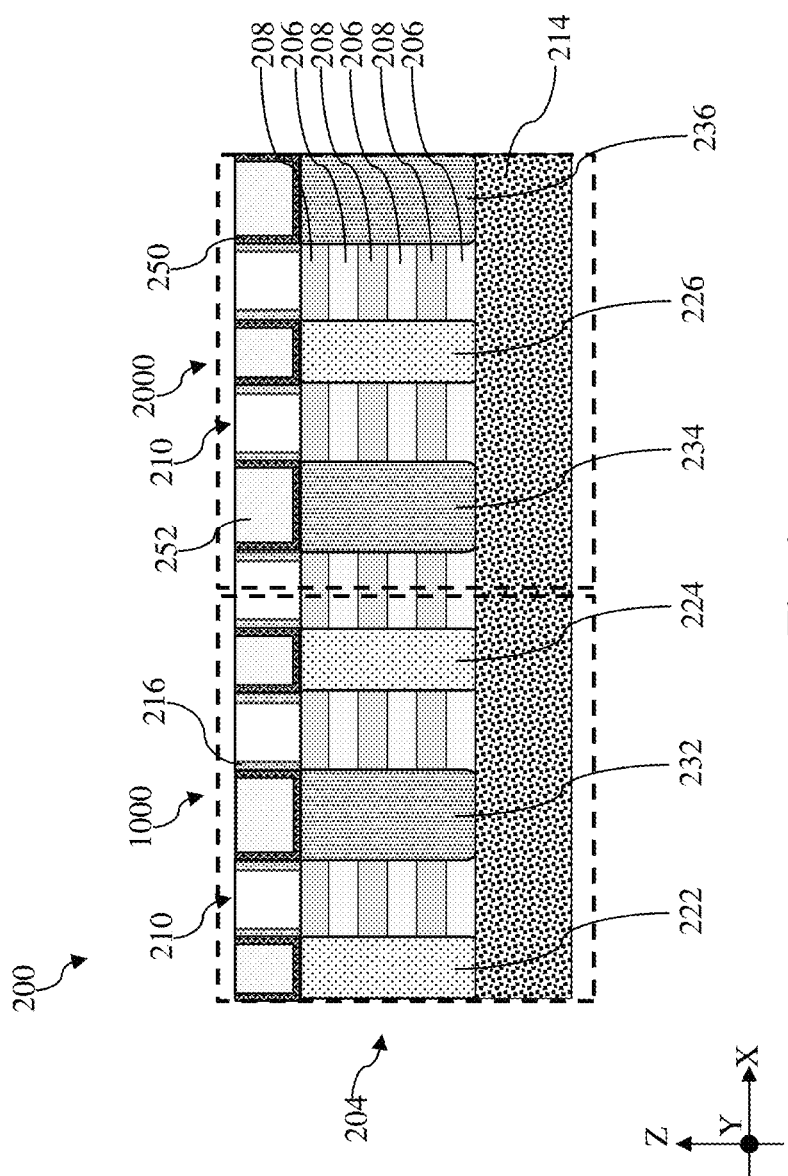
FIGS. 4-7 illustrate fragmentary cross-sectional view of a semiconductor device in the second region, according to various aspects of the present disclosure.

A semiconductor device 200 in the second region 14 is enlarged and shown in FIG. 3. A cross-sectional view of the semiconductor device 200 is illustrated in FIG. 4. The semiconductor device 200 shown in FIGS. 3 and 4 demonstrate the operations at block 104. The semiconductor device 200 includes a second fin-shaped structure 204. The second fin-shaped structure 204 may be elongated in shape and extend along one of the X direction or the Y direction. As shown in FIG. 4, the second fin-shaped structure 204 may be formed of a stack that includes second semiconductor layers 208 interleaved by first semiconductor layers 206. In one embodiment, the second semiconductor layers 208 are made of silicon (Si) and the first semiconductor layers 206 are made of silicon germanium (SiGe). In some embodiments, the first fin-shaped structure in the first region 12 are similar to the second fin-shaped structure 204 in the second region 14. In some other embodiments, the second fin-shaped structure 204 in the second region 14 may have different dimensions from the first fin-shaped structure in the first region 12. In one embodiments, a width of the second fin-shaped structure 204 along the Y direction in the second region 14 may be greater than a width of the first fin-shaped structure along the Y direction in the first region 12. It is noted that the substrate is not shown in FIG. 4 as the substrate may be replaced by a backside dielectric layer 214 during the formation of back side contact structures and backside power rails. After the first fin-shaped structure and the second fin-shaped structure 204 are formed, an isolation feature 212 is formed to isolate the fin-shaped structures from adjacent fin-shaped structures. The isolation feature 212 may also be referred to as a shallow trench isolation (STI) feature 212. In some embodiments, isolation feature 212 may include silicon oxide, silicon nitride, silicon oxynitride, fluorine-doped silicate glass (FSG), a low-k dielectric, combinations thereof, and/or other suitable materials.

Referring to FIG. 1, method 100 includes a block 106 where dummy gate stacks are formed over the first fin-shaped structure in the first region 12 and the second fin-shaped structure (e.g., the second fin-shaped structure 204 in FIG. 4) in the second region 14. In the depicted embodiments, a gate-last or gate replacement process is adopted and dummy gate stacks are formed to endure source/drain formation processes before they are replaced with high-k metal gate structures, such as second gate structures 210 in FIGS. 3 and 4. Each of the dummy gate stacks may include a dummy dielectric layer and a dummy gate electrode. In some embodiments, the dummy dielectric layer may include silicon oxide and the dummy gate electrode may include polysilicon. The dummy gate electrode may be referred to as polysilicon gate when it is formed of polysilicon. A gate spacer 216 is then deposited along sidewalls of the dummy gate stacks. The gate spacer 216 may also be referred to as top gate spacer and may define a gate trench for formation of the gate structures (including the first gate structures in the first region 12 and second gate structures 210 in the second region, the second gate structures 210 are shown in FIGS. 3 and 4) after the removal of the dummy gate stacks. In the first region 12 where MBC transistors are formed, the dummy gate stacks are formed over channel regions where sacrificial layers 206 will be selectively removed to release the channel layers 208 as vertically stacked channel members. In the second region 14 where thermal sensors are formed, there are no channel regions. The dummy gate stacks formed in the second region 14 help to define n-type implanted regions and p-type implanted regions. Even the second gate structures 210 that replace dummy stacks in the second region 14 are not really functional. As will be described below, no channel members will be released from the second fin-shaped structure 204 and the second gate structures 210 in the second region 14 are electrically floating. The gate spacer 216 may include silicon oxide, silicon nitride, silicon oxynitride, silicon carbide, silicon oxycarbonitride, or a metal oxide.

Referring to FIG. 1, method 100 includes a block 108 where source/drain features are formed in the first fin-shaped structure in the first region 12 and implanted regions are formed in the second fin-shaped structure (e.g., the second fin-shaped structure 204 in FIG. 4) in the second region 14. Operations at block 108 bifurcate with respect to the first region 12 and the second region 14. At block 108, source/drain regions of the first fin-shaped structure in the first region 12 is recessed to form source/drain trenches. Sidewalls of the channel layers 208 and sacrificial layers 206 in the first fin-shaped structure are exposed in the source/drain trenches. The sidewalls of the sacrificial layers 206 are then partially and selectively recessed to formed form inner spacer recesses in the first region 12. Inner spacer features are then formed in the inner spacer recesses. The inner spacer features may include silicon oxide, silicon nitride, silicon oxynitride, silicon carbide, or silicon oxycarbonitride. One or more epitaxial layers are then deposited into the source/drain trenches to form the source/drain features. When n-type MBC transistors are desired in the first region 12, the source/drain features may include silicon (Si) doped with an n-type dopant, such as phosphorus (P) or arsenic (As). That is, when n-type MBC transistors are desired in the first region, the source/drain features may include phosphorus-doped silicon (Si:P), arsenic doped silicon (Si:As), or both. When p-type MBC transistors are desired, the source/drain features may include silicon germanium (SiGe) doped with a p-type dopant, such as boron (B) or gallium (Ga). That is, when p-type MBC transistors are desired, the source/drain features may include boron-doped silicon germanium (SiGe:B), gallium-doped silicon germanium (SiGe:Ga), or both.

It is noted that the source/drain regions of the first fin-shaped structure in the first region 12 are recessed to form source/drain trenches and new epitaxial features are epitaxially deposited/grown in the source/drain trenches. The source/drain features may be in-situ doped when they are deposited using vapor phase epitaxy (VPE) or molecular beam epitaxy (MBE). The same cannot be said for the second fin-shaped structure 204 in the second region 14. At block 108, the second fin-shaped structure 204 in the second region 14 is not recessed to form source/drain trenches and no new epitaxial features are epitaxially deposited/grown in the second region 14 at block 108. In some embodiments, the second region 14 may be covered by one or more hard mask layers while the first fin-shaped structure in the first region 12 undergoes source/drain trench formation, formation of inner spacer recesses, deposition of inner spacer features, and epitaxial deposition of source/drain features. At block 108, the second fin-shaped structure 204 in the second region 14 may be subject to implantation processes to form p-type implanted regions, such as p-type implanted regions 222, 224 and 226, and n-type implanted regions, such as n-type implanted regions 232, 234 and 236. To form the n-type and p-type doped regions in the second region, ion implantation processes may be performed to the second fin-shaped structure 204. In an example process, a first patterned photomask is formed over the second region 14 to expose the n-type implanted regions 232, 234 and 236 and a first ion implantation process is performed to implant an n-type dopant, such as phosphorus (P) or arsenic (As). The first patterned photomask is then removed and a second patterned photomask is formed over the second region 14 to expose the p-type implanted regions 222, 224 and 226. A second ion implantation process is performed to implant a p-type dopant, such as boron (B) or gallium (Ga).

Reference is made to FIG. 3. In some embodiment, widths of the n-type implanted regions may be greater than widths of the n-type p-type implanted regions. In the depicted embodiment, each of the n-type implanted regions (232, 234, and 236) may have a first width W1 along the X direction and each of the p-type implanted regions (222, 224, and 226) may have a second width W2 along the X direction. The first width W1 is greater than the second width W2. In some instances, the first width W1 may be between about 180 nm and about 220 nm and the second width W2 may be between about 20 nm and about 40 nm. In the depicted embodiment, the first width W1 is greater than the second width W2 to meet needs necessitated by the design of the MBC transistors in the first region 12. That is, the first width W1 and the second width W2 are selected to improve process windows for the first region 12 and to reduce junction resistance for the second region 14.

Referring to FIG. 1, method 100 includes a block 110 where channel members in the first region 12 are selectively released while the same operations are not performed in the second region 14. After the source/drain features are formed in the first region 12 and the implanted regions are formed in the second region 14, a contact etch stop layer (CESL) 250 (shown in FIG. 4) and an interlayer dielectric (ILD) layer 252 (shown in FIG. 4) are then deposited over the workpiece 10, including over the source/drain features in the first regions 12 or over the implanted regions (such as the p-type implanted regions 222, 224 and 226 and the n-type implanted regions 232, 234 and 236). While not explicitly shown, after the deposition of the CESL 250 and the ILD layer 252, the workpiece 10 may be subjected to a planarization process, such as a chemical mechanical polishing (CMP) process, to expose the dummy gate stacks in the first region 12 and the second region 14. A selective etch process is then performed to selectively remove the dummy gate stacks, expose sidewalls of the channel layers 208 and the sacrificial layers 206 across the workpiece 10. After the dummy gate stacks are removed, a photomask is deposited over the workpiece 10 to cover the second region 14, while the first region 12 remains exposed. With the second region 14 covered, the sacrificial layers 206 in the first region 12 are selectively removed to release the channel layers 208 as channel members. Because the second region 14 is covered during the channel release processes, the second fin-shaped structure 204 in the second region 14 remains substantially intact, with the channel layers 208 being interleaved by the sacrificial layers 206. The release of the channel layers 208 as channel members and formation of a gate structure around each of the channel members may increase the failure rate of BJT. That is why no channel release operations are performed to the second region in the depicted embodiments. In alternative embodiments (not illustrated) where the implanted regions are sufficiently spaced apart from one another, channel release operations may be performed both in the first region 12 and the second region 14.

Referring to FIG. 1, method 100 includes a block 112 where first gate structures are formed in the first region 12 and second gate structures 210 are formed in the second region. The first gate structures and the second gate structures 210 may be substantially similar in terms of composition. Each of the first gate structures and the second gate structures 210 includes an interfacial layer, a gate dielectric layer over the interfacial layer, and a gate electrode over the gate dielectric layer. In some embodiments, the interfacial layer may include a dielectric material such as silicon oxide layer or silicon oxynitride. The gate dielectric layer may include hafnium oxide, titanium oxide, hafnium zirconium oxide, tantalum oxide, hafnium silicon oxide, zirconium oxide, zirconium silicon oxide, combinations thereof, or other suitable materials. The gate electrode may include one or more work function layers and a metal fill layer. The one or more work function layers may include n-type work function layers and p-type work function layers. Example n-type work function layers may be formed of aluminum, titanium aluminide, titanium aluminum carbide, tantalum silicon carbide, tantalum silicon aluminum, tantalum silicon carbide, tantalum silicide, or hafnium carbide. Example p-type work function layers may be formed of titanium nitride, titanium silicon nitride, tantalum nitride, tungsten carbonitride, or molybdenum. The metal fill layer may be formed of a metal, such as tungsten (W), ruthenium (Ru), cobalt (Co) or copper (Cu).

The first gate structures in the first region 12 and the second gate structures 210 in the second region 14 may have different structure. In the depicted embodiments, the first fin-shaped structure in the first region 12 undergoes channel release operations at block 110 while the second fin-shaped structure in the second region 14 is covered. Each of the first gate structures therefore wraps around each of the released channel members formed of the channel layers 208. Different from the first gate structures in the first region 12, each of the second gate structures 210 in the second region 14 is disposed over the second fin-shaped structure 204. Because the sacrificial layers 206 in the second fin-shaped structure 204 are not selectively removed, the second gate structures 210 do not extend between any two of the channel layers 208 in the second fin-shaped structures 204.

Referring to FIG. 4, in semiconductor device 200, the second gate structures 210 wraps over portions of the second fin-shaped structure 204 between two adjacent implanted regions. In FIG. 4, a second gate structure 210 wraps over a portion of the second fin-shaped structure 204 between the first p-type implanted region 222 and the first n-type implanted region 232; another second gate structure 210 wraps over a portion of the second fin-shaped structure 204 between the first n-type implanted region 232 and the second p-type implanted region 224; another second gate structure 210 wraps over a portion of the second fin-shaped structure 204 between the second p-type implanted region 224 and the second n-type implanted region 234; another second gate structure 210 wraps over a portion of the second fin-shaped structure 204 between the second n-type implanted region 234 and the third p-type implanted region 226; and yet another second gate structure 210 wraps over a portion of the second fin-shaped structure 204 between the third p-type implanted region 226 and the third n-type implanted region 236. Along the X direction, it can be said that the a second gate structure 210 is disposed between the first p-type implanted region 222 and the first n-type implanted region 232; another second gate structure 210 is disposed between the first n-type implanted region 232 and the second p-type implanted region 224; another second gate structure 210 is disposed between the second p-type implanted region 224 and the second n-type implanted region 234; another second gate structure 210 is disposed between the second n-type implanted region 234 and the third p-type implanted region 226; and yet another second gate structure 210 is disposed between the third p-type implanted region 226 and the third n-type implanted region 236.

Figure 5:
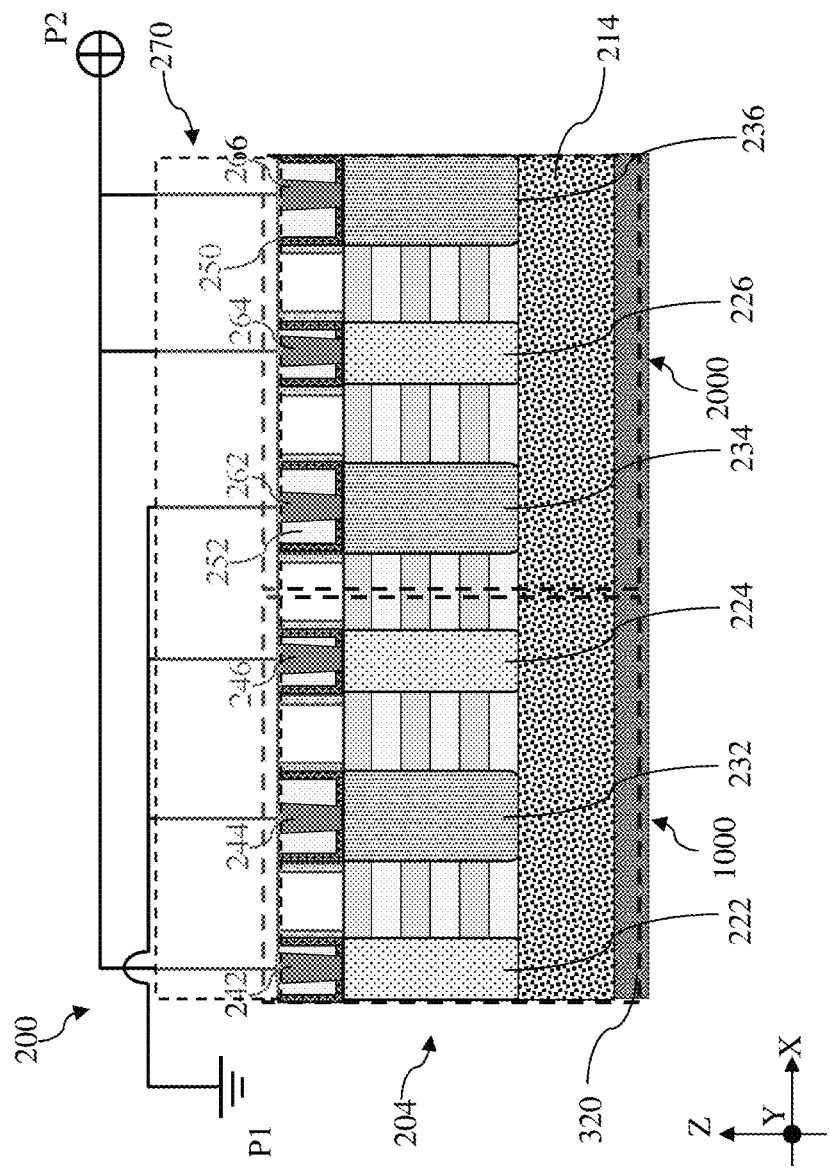

To better illustrate various aspects of the present disclosure, operations at blocks 114 and 116 will be described below with references to FIGS. 5, 6 and 7, which illustrate the semiconductor device 200 in the second region 14 of the workpiece 10. FIGS. 5, 6 and 7 illustrate three embodiments with different routing arrangements. In each of the embodiments in FIGS. 5, 6 and 7, the first p-type implanted region 222, the first n-type implanted region 232, and the second p-type implanted region 224 are configured to function as a PNP bipolar junction transistor (BJT) 1000 and the second n-type implanted region 234, the third p-type implanted region 226, and the third n-type implanted region 236 are configured to function as an NPN bipolar junction transistor (BJT) 2000. In the PNP BJT 1000, the first p-type implanted region 222 is a first emitter (222), the first n-type implanted region 232 is a first base (232), and the second p-type implanted region 224 is a first collector (224). In the NPN BJT 2000, the second n-type implanted region 234 is the second emitter (234), the third p-type implanted region 226 is the second base (226), and the third n-type implanted region 236 is the second collector (236). In each of the embodiments in FIGS. 5, 6 and 7, the first base 232, the first collector 224 and the second emitter 234 are coupled to a first potential P1; and the first emitter 222, the second base 226 and the second collector 236 are coupled to a second potential P2. Put differently, the front side and back side contacts in FIGS. 5, 6 and 7 are formed to realize the foregoing connection.

Referring to FIGS. 1, 5, 6, and 7, method 100 includes a block 114 where frontside contacts and a frontside interconnect structure 270 are formed. In embodiments represented in FIG. 5, the connection to the first potential P1 and the second potential P2 is achieved completely through frontside contacts and frontside interconnect structure. In embodiments represented in FIG. 6, only the connection to the second potential P2 is achieved through frontside contacts and frontside interconnect structure while connection to the first potential P1 is achieved through backside contacts and backside power rails. In embodiments represented in FIG. 7, only the connection to the first potential P1 is achieved through frontside contacts and frontside interconnect structure while connection to the second potential P2 is achieved through backside contacts and backside power rails.

In embodiments illustrated in FIG. 5, operations at block 114 form a first contact feature 242 over the first emitter 222, a second contact feature 244 over the first base 232, a third contact feature 246 over the first collector 224, a fourth contact feature 262 over the second emitter 234, a fifth contact feature 264 over the second base 226, and a sixth contact feature 266 over the second collector 236. To form these frontside contact features, frontside contact openings are formed through the ILD layer 252 and the CESL 250 to expose the first emitter 222, the first base 232, the first collector 224, the second emitter 234, the second base 226, and the second collector 236. To reduce contact resistance, a silicide layer may be formed on the exposed surfaces of the first emitter 222, the first base 232, the first collector 224, the second emitter 234, the second base 226, and the second collector 236. The silicide layer may include titanium silicide (TiSi), nickel silicide (NiSi), cobalt silicide (CoSi), or titanium silicon nitride (TiSiN). Then, a metal fill layer for the contact features are formed over the silicide layer. The metal fill layer may include tungsten (W), ruthenium (Ru), cobalt (Co), nickel (Ni), or copper (Cu). In some embodiments, a barrier layer or a liner may be formed over sidewalls of the frontside contact openings. The barrier layer or the liner may separate the metal fill layer from the ILD layer 252. In some instances, the barrier layer or the liner may include titanium nitride (TiN), tantalum nitride (TaN), titanium (Ti), molybdenum (Mo), cobalt nitride (CoN), tungsten nitride (WN), or titanium silicon nitride (TiSiN).

In embodiments illustrated in FIG. 6, only the first contact feature 242, the fifth contact feature 264, and the sixth contact feature 266 are formed. The first contact feature 242 is formed over and electrically coupled to the first emitter 222. The fifth contact feature 264 is formed over and electrically coupled to the second base 226. The sixth contact feature 266 is formed over and electrically coupled to the second collector 236.

In embodiments illustrated in FIG. 7, only the second contact feature 244, the third contact feature 246, and the fourth contact feature 262 are formed. The second contact feature 244 is formed over and electrically coupled to the first base 232. The third contact feature 246 is formed over and electrically coupled to the first collector 224. The fourth contact feature 262 is formed over and electrically coupled to the second emitter 234.

After the formation of the frontside contact features, a frontside interconnect structure 270 is formed over the frontside contact features to interconnect them. The frontside interconnect structure 270 may include a plurality of conductive features, such as conductive lines and conductive vias, embedded in a plurality of intermetal dielectric layers (IMDs). The conductive lines and conductive vias may include aluminum (Al), copper (Cu), ruthenium (Ru), tungsten (W), cobalt (Co), or titanium nitride (TiN). In the embodiments represented in FIG. 5, the frontside interconnect structure 270 connects the second contact feature 244 (coupled to the first base 232), the third contact feature 246 (coupled to the first collector 224) and the fourth contact feature 262 (coupled to the second emitter 234) to the first potential P1. The frontside interconnect structure 270 in FIG. 5 also connects the first contact feature 242 (coupled to the first emitter 222), the fifth contact feature 264 (coupled to the second base 226) and the sixth contact feature 266 (coupled to the second collector 236) to the second potential P2. In the embodiments represented in FIG. 6, the frontside interconnect structure 270 connects the first contact feature 242 (coupled to the first emitter 222), the fifth contact feature 264 (coupled to the second base 226) and the sixth contact feature 266 (coupled to the second collector 236) to the second potential P2. In the embodiments represented in FIG. 7, the frontside interconnect structure 270 connects the second contact feature 244 (coupled to the first base 232), the third contact feature 246 (coupled to the first collector 224) and the fourth contact feature 262 (coupled to the second emitter 234) to the first potential P1.

Referring to FIGS. 1, 5, 6, and 7, method 100 includes a block 116 where backside contacts and power rails are formed. In embodiments represented in FIG. 5, the connection to the first potential P1 and the second potential P2 is achieved completely through frontside contacts and frontside interconnect structure. In embodiments represented in FIG. 6, only the connection to the first potential P1 is achieved through backside contacts and backside power rails while connection to the second potential P2 is achieved through frontside contacts and frontside power rails. In embodiments represented in FIG. 7, only the connection to the second potential P2 is achieved through backside contacts and backside power rails while connection to the first potential P1 is achieved through frontside contacts and frontside interconnect structures.

In embodiments illustrated in FIG. 5, while operations at block 116 do not form any backside contacts to couple to any of the first emitter 222, the first base 232, the first collector 224, the second emitter 234, the second base 226, and the second collector 236, they may form backside contacts to couple to source features in the first region 12. With respect to the semiconductor device 200 in the first region 12, operations at block 116 replace the substrate with the backside dielectric layer 214. In some embodiments, block 116 includes bonding the workpiece 10 to a carrier substrate, flipping the workpiece 10 up-side-down, thinning the substrate until the isolation feature 212 is exposed, selectively removing the remaining substrate, and depositing the backside dielectric layer 214. In some embodiments, the backside dielectric layer 214 may include silicon oxide and silicon nitride. In some other embodiments, the backside dielectric layer 214 may include low-k dielectric materials, such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), or the like.

In embodiments illustrated in FIG. 6, the first backside contact 302, the second backside contact 304, and the third backside contact 306 are formed. In an example process, backside contact openings are formed through the backside dielectric layer 214 to selectively expose the first base 232, the first collector 224, and the second emitter 234. To reduce contact resistance, a silicide layer may be formed on the exposed backside surfaces of the first base 232, the first collector 224, and the second emitter 234. The silicide layer may include titanium silicide (TiSi), nickel silicide (NiSi), cobalt silicide (CoSi), or titanium silicon nitride (TiSiN). Then, a metal fill layer for the backside contacts are formed over the silicide layer. The metal fill layer may include tungsten (W), ruthenium (Ru), cobalt (Co), nickel (Ni), or copper (Cu). In some embodiments, a barrier layer or a liner may be formed over sidewalls of the frontside contact openings. The barrier layer or the liner may separate the metal fill layer from the ILD layer 252. In some instances, the barrier layer or the liner may include silicon nitride (SiN), titanium nitride (TiN), tantalum nitride (TaN), titanium (Ti), molybdenum (Mo), cobalt nitride (CoN), tungsten nitride (WN), or titanium silicon nitride (TiSiN). As a result, the first backside contact 302 is formed over and electrically coupled to the first base 232. The second backside contact 304 is formed over and electrically coupled to the first collector 224. The third backside contact 306 is formed over and electrically coupled to the second emitter 234.

In embodiments illustrated in FIG. 7, the fourth backside contact 308, the fifth backside contact 310, and the sixth backside contact 312 are formed. The fourth backside contact 308 is formed over and electrically coupled to the first emitter 222. The fifth backside contact 310 is formed over and electrically coupled to the second base 226. The sixth backside contact 312 is formed over and electrically coupled to the second collector 236.

After the formation of the backside contacts, a backside power rail 320 is formed over the backside contacts to interconnect them. The backside power rail 320 may be defined in a backside interlayer dielectric (ILD) layer. The backside ILD layer may have a composition similar to that of the ILD layer 252. The backside power rail 320 may include aluminum (Al), copper (Cu), ruthenium (Ru), tungsten (W), cobalt (Co), or titanium nitride (TiN). In the embodiments represented in FIG. 5, the backside power rail 320 is not coupled to the PNP BJT 1000 and the NPN BJT 2000. In the embodiments represented in FIG. 6, the backside power rail 320 connects the first backside contact 302 (coupled to the first base 232), the second backside contact 304 (coupled to the first collector 224) and the third backside contact 306 (coupled to the second emitter 234) to the first potential P1. In the embodiments represented in FIG. 7, the backside power rail 320 connects the fourth backside contact 308 (coupled to the first emitter 222), the fifth backside contact 310 (coupled to the second base 226) and the sixth backside contact 312 (coupled to the second collector 236) to the second potential P2.

The semiconductor device 200 in FIG. 5, 6, or 7, when so connected as shown therein, functions an equivalent circuit 500 shown in FIG. 8. As shown in FIG. 8, because the first emitter 222 of the PNP BJT 1000 is coupled to the second base 226 of the NPN BJT 2000 and the first base 232 of the PNP BJT 1000 is coupled to the second emitter 234 of the NPN BJT 2000, the base-emitter voltage ($V_{BE}$) of the PNP BJT 1000 is identical to the base-emitter voltage ($V_{BE}$) of the NPN BJT 2000. This common base-emitter voltage ($V_{BE}$) is the voltage difference between the first potential P1 and the second potential P2. When connected as such, the PNP BJT 1000 and the NPN BJT 2000 form a complementary bipolar junction transistor (CBJT). As will be described further below, the CBJT may be used to sense change in thermal energy. For that reason, the CBJT of the present disclosure is a CBJT thermal sensor. For the foregoing reasons, the equivalent circuit 500 shows a CBJT or a CBJT thermal sensor and may be referred to as one.

Pulling the base-emitter voltage ($V_{BE}$) of the PNP BJT 1000 and the NPN BJT 2000 to the same level provides the CBJT with advantages in terms of reducing thermal sensing variation. In some embodiments, the second region 14, along with the CBJTs therein, may be strategically placed in various hot spots around the workpiece 10 such that the thermal sensors measure temperature where it matters the most. In those embodiments, the second region 14 may be disposed around the center of the workpiece 10, around edges of the workpiece 10, in dense areas, or in isolated areas. Due to the difference in location, the implantation of dopants in the implanted regions in the second fin-shaped structure 204 may not be uniform. It is observed that the non-uniformity of dopants in the n-type implanted regions and p-type implanted regions may have opposite effects on the BJTs. For example, when non-uniformity of dopants in a second region 14 shifts the base-emitter voltage ($V_{BE}$) of the PNP BJT 1000 in one direction, the same non-uniformity of dopants in that second region 14 would shift the base-emitter voltage ($V_{BE}$) of the NPN BJT 2000 in the other direction. By pulling the base-emitter voltage ($V_{BE}$) of the PNP BJT 1000 and the NPN BJT 2000 to the same level, the voltage shifting due to locational implantation non-uniformity may be canceled. This allows the CBJT or CBJT thermal sensor to be more stable and accurate.

The CBJT 500 (or CBJT thermal sensor 500) may function as a thermal sensor. Reference is now made to FIG. 9, which plots the change of voltage difference (i.e., P2–P1) between the second potential P2 and the first potential P2 against the absolute temperature (measured in Kelvin, or K). It is observed that the voltage difference between P2 and P1 may drop substantially linearly with the increase of the absolute temperature. The CBJT 500 may be calibrated by measuring at least a first voltage difference V1 at a first temperature T1 and a second voltage difference V2 at a second temperature T2. These at least two data points may help to establish a characteristic V-T curve of the CBJT 500. When implemented in an IC device, base-emitter voltage ($V_{BE}$) the CBJT 500 may be converted to thermal data or temperature reading using this characteristic V-T curve. This calibration process also explains why the dimensions of the second fin-shaped structure 204 in the second region 14 may not always be the same as those of the first fin-shaped structure in the first region 12. Changing the dimensions of the second fin-shaped structure 204 of a calibrated CBJT 500 to match those of the first fin-shaped structure would change the characteristic V-T curve. New calibration processes or even process changes may be required to derive a new characteristic V-T curve.

Although not intended to be limiting, one or more embodiments of the present disclosure provide many benefits to a semiconductor device and the formation thereof. For example, the CBJT thermal sensor of the present disclosure is fabricated along with MBC transistors using similar FEOL processes. As such, the CBJT thermal sensor may be disposed adjacent to the MBC transistors and may be fabricated using minimum additional processes. The CBJT construction cancels out implantation non-uniformity and allows for more stable and accurate thermal sensing capability.

In one example aspect, the present disclosure provides a semiconductor device in accordance with some embodiments. The semiconductor device includes a dielectric layer and a fin-shaped structure disposed over the dielectric layer. The fin-shaped structure includes a first p-type doped region, a second p-type doped region, and a third p-type doped region, and a first n-type doped region, a second n-type doped region, and a third n-type doped region interleaving the first p-type doped region, the second p-type doped region, and the third p-type doped region. The first p-type doped region, the third p-type doped region and the third n-type doped region are electrically coupled to a first potential. The second p-type doped region, the first p-type n-type doped region and the second n-type doped region are electrically coupled to a second potential different from the first potential.

In some embodiments, the fin-shaped structure includes a plurality of first semiconductor layers interleaved by a plurality of second semiconductor layers. In some implementations, the plurality of first semiconductor layers include silicon and the plurality of second semiconductor layers include silicon germanium. In some instances, the semiconductor device may further include a first gate structure disposed between the first p-type doped region and the first n-type doped region, a second gate structure disposed between the first n-type doped region and the second p-type doped region, a third gate structure disposed between the second p-type doped region and the second n-type doped region, a fourth gate structure disposed between the second n-type doped region and the third p-type doped region, and a fifth gate structure disposed between the third p-type doped region and the third n-type doped region. In some instances, each of the first gate structure, the second gate structure, the third gate structure, the fourth gate structure, and the fifth gate structure wraps over the fin-shaped structure as a whole and does not extend into the fin-shaped structure. In some embodiments, each of the first gate structure, the second gate structure, the third gate structure, the fourth gate structure, and the fifth gate structure is electrically floating. In some implementations, the semiconductor device may further include a contact etch stop layer disposed over the first p-type doped region, the second p-type doped region, the third p-type doped region, the first n-type doped region, the second n-type doped region, and the third n-type doped region, and an interlayer dielectric layer over the contact etch stop layer. The first p-type doped region, the third p-type doped region and the third n-type doped region are electrically coupled to the first potential by way of a first front side contact via, a second front side contact via, and a third front side contact via extending through the interlayer dielectric layer and the contact etch stop layer. The second p-type doped region, the first n-type doped region and the second n-type doped region are electrically coupled to the second potential by way of a fourth front side contact via, a fifth front side contact via, and a sixth front side contact via extending through the interlayer dielectric layer and the contact etch stop layer. In some embodiments, the first p-type doped region, the third p-type doped region and the third n-type doped region are electrically coupled to the first potential by way of a first backside contact via, a second backside contact via, and a third backside contact via extending through the dielectric layer. In some instances, the second p-type doped region, the first n-type doped region and the second n-type doped region are electrically coupled to the second potential by way of a first backside contact via, a second backside contact via, and a third backside contact via extending through the dielectric layer.

In some embodiments, the fin-shaped structure includes a plurality of first semiconductor layers interleaved by a plurality of second semiconductor layers. In some implementations, the plurality of first semiconductor layers include silicon and the plurality of second semiconductor layers include silicon germanium. In some instances, the semiconductor device may further include a first gate structure disposed between the first p-type doped region and the first n-type doped region, a second gate structure disposed between the first n-type doped region and the second p-type doped region, a third gate structure disposed between the second p-type doped region and the second n-type doped region, a fourth gate structure disposed between the second n-type doped region and the third p-type doped region, and a fifth gate structure disposed between the third p-type doped region and the third n-type doped region. In some instances, each of the first gate structure, the second gate structure, the third gate structure, the fourth gate structure, and the fifth gate structure wraps over the fin-shaped structure as a whole and does not extend into the fin-shaped structure. In some embodiments, each of the first gate structure, the second gate structure, the third gate structure, the fourth gate structure, and the fifth gate structure is electrically floating. In some implementations, the semiconductor device may further include a contact etch stop layer disposed over the first p-type doped region, the second p-type doped region, the third p-type doped region, the first n-type doped region, the second n-type doped region, and the third n-type doped region, and an interlayer dielectric layer over the contact etch stop layer. The first p-type doped region, the third p-type doped region and the third n-type doped region are electrically coupled to the first potential by way of a first front side contact via, a second front side contact via, and a third front side contact via extending through the interlayer dielectric layer and the contact etch stop layer. The second p-type doped region, the first p-type doped region and the second p-type doped region are electrically coupled to the second potential by way of a fourth front side contact via, a fifth front side contact via, and a sixth front side contact via extending through the interlayer dielectric layer and the contact etch stop layer. In some embodiments, the first p-type doped region, the third p-type doped region and the third n-type doped region are electrically coupled to the first potential by way of a first backside contact via, a second backside contact via, and a third backside contact via extending through the dielectric layer. In some instances, the second p-type doped region, the first p-type doped region and the second p-type doped region are electrically coupled to the second potential by way of a first backside contact via, a second backside contact via, and a third backside contact via extending through the dielectric layer.

Another one aspect of the present disclosure pertains to a thermal sensor. The thermal sensor includes a PNP bipolar junction transistor (BJT) and an NPN BJT. The PNP BJT includes a first emitter, a first base, and a first collector. The NPN BJT includes a second emitter, a second base, and a second collector. The first emitter, the second base, and the second collector are coupled to a first potential and the first base, the first collector, and the second emitter are coupled to a second potential different from the first potential.

In some embodiments, each of the first emitter, the first collector, and the second base includes silicon, silicon germanium and a p-type dopant and each of the first base, the second emitter, and the second collector includes silicon, silicon germanium and an n-type dopant. In some implementations, each of the first emitter, the first collector, and the second base includes a first portion of a fin-shaped structure and is doped with a p-type dopant and each of the first base, the second emitter, and the second collector includes a second portion of the fin-shaped structure and is doped with an n-type dopant. In some instances, the fin-shaped structure is disposed over a dielectric layer. In some implementations, the fin-shaped structure includes a plurality of first semiconductor layers interleaved by a plurality of second semiconductor layers. In some embodiments, the plurality of first semiconductor layers includes silicon and the plurality of second semiconductor layers include silicon germanium. In some embodiments, the fin-shaped structure extends lengthwise along a direction, each of the first emitter, the first collector, and the second base includes a first width along the direction. Each of the first base, the second emitter, and the second collector includes a second width along the direction. The second width is greater than the first width.

Yet another aspect of the present disclosure pertains to a method. The method includes receiving a fin-shaped structure disposed on a substrate, wherein the fin-shaped structure includes a plurality of first semiconductor layers interleaved by a plurality of second semiconductor layers, implanting a first region, a second region, and a third region of the fin-shaped structure with a p-type dopant, implanting a fourth region, a fifth region, and a sixth region of the fin-shaped structure with an n-type dopant, and replacing the substrate with a dielectric layer.

In some embodiments, the first region, the second region, and the third region are interleaved by the fourth region, the fifth region, and the sixth region. In some implementations, the method may further include forming a first gate structure between the first region and the fourth region, forming a second gate structure between the fourth region and the second region, forming a third gate structure between the second region and the fifth region, forming a fourth gate structure between the fifth region and the third region, and forming a fifth gate structure between the third region and the sixth region. In some implementations, the method may further include forming an interconnect structure to electrically connect the fourth region, the second region and the fifth region to a first potential, and electrically connect the first region, the third region, and the sixth region to a second potential.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
  a dielectric layer; and
  a fin-shaped structure disposed over the dielectric layer, the fin-shaped structure comprising:
    a first p-type doped region, a second p-type doped region, and a third p-type doped region, and
    a first n-type doped region, a second n-type doped region, and a third n-type doped region interleaving the first p-type doped region, the second p-type doped region, and the third p-type doped region,
  wherein the first p-type doped region, the third p-type doped region and the third n-type doped region are electrically coupled together to a first potential,
  wherein the second p-type doped region, the first n-type doped region and the second n-type doped region are electrically coupled together to a second potential different from the first potential.

2. The semiconductor device of claim 1, wherein the fin-shaped structure comprises a plurality of first semiconductor layers interleaved by a plurality of second semiconductor layers.

3. The semiconductor device of claim 2,
  wherein the plurality of first semiconductor layers comprise silicon,
  wherein the plurality of second semiconductor layers comprise silicon germanium.

4. The semiconductor device of claim 1, further comprising
  a first gate structure disposed between the first p-type doped region and the first n-type doped region;
  a second gate structure disposed between the first n-type doped region and the second p-type doped region;
  a third gate structure disposed between the second p-type doped region and the second n-type doped region;
  a fourth gate structure disposed between the second n-type doped region and the third p-type doped region; and
  a fifth gate structure disposed between the third p-type doped region and the third n-type doped region.

5. The semiconductor device of claim 4, wherein each of the first gate structure, the second gate structure, the third gate structure, the fourth gate structure, and the fifth gate structure wraps over the fin-shaped structure as a whole and does not extend into the fin-shaped structure.

6. The semiconductor device of claim 4, wherein each of the first gate structure, the second gate structure, the third gate structure, the fourth gate structure, and the fifth gate structure is electrically floating.

7. The semiconductor device of claim 1, further comprising:
  a contact etch stop layer disposed over the first p-type doped region, the second p-type doped region, the third p-type doped region, the first n-type doped region, the second n-type doped region, and the third n-type doped region; and
  an interlayer dielectric layer over the contact etch stop layer,
  wherein the first p-type doped region, the third p-type doped region and the third n-type doped region are electrically coupled to the first potential by way of a first front side contact via, a second front side contact via, and a third front side contact via extending through the interlayer dielectric layer and the contact etch stop layer,
  wherein the second p-type doped region, the first n-type doped region and the second n-type doped region are electrically coupled to the second potential by way of a fourth front side contact via, a fifth front side contact via, and a sixth front side contact via extending through the interlayer dielectric layer and the contact etch stop layer.

8. The semiconductor device of claim 1,
  wherein the first p-type doped region, the third p-type doped region and the third n-type doped region are electrically coupled to the first potential by way of a first backside contact via, a second backside contact via, and a third backside contact via extending through the dielectric layer.

9. The semiconductor device of claim 1,
  wherein the second p-type doped region, the first n-type doped region and the second n-type doped region are electrically coupled to the second potential by way of a first backside contact via, a second backside contact via, and a third backside contact via extending through the dielectric layer.

10. A semiconductor structure, comprising:
  a dielectric layer; and
  a fin-shaped structure disposed over the dielectric layer and extending along a direction, the fin-shaped structure comprising:
    a first p-type doped region and a second p-type doped region,
    a first n-type doped region disposed between the first p-type doped region and the second p-type doped region along the direction,
    a second n-type doped region and a third n-type doped region,
    a third p-type doped region disposed between the second n-type doped region and the third n-type doped region along the direction,
  wherein the first p-type doped region, the third p-type doped region and the third n-type doped region are electrically coupled together to a first potential,
  wherein the second p-type doped region, the first n-type doped region and the second n-type doped region are electrically coupled together to a second potential different from the first potential.

11. The semiconductor structure of claim 10, wherein along the direction, a width of each of the first n-type doped region, the second n-type doped region, and the third n-type doped region is greater than a width of each of the first p-type doped region, the second p-type doped region, and the third p-type doped region.

12. The semiconductor structure of claim 10, wherein each of the first n-type doped region, the second n-type doped region, and the third n-type doped region comprises silicon, silicon germanium, and an n-type dopant.

13. The semiconductor structure of claim 10, wherein each of the first p-type doped region, the second p-type doped region, and the third p-type doped region comprises silicon, silicon germanium, and a p-type dopant.

14. The semiconductor structure of claim 10, wherein the first potential is greater than the second potential.

15. The semiconductor structure of claim 10, further comprising:
    a first gate structure disposed between the first p-type doped region and the first n-type doped region; and
    a second gate structure disposed between the first n-type doped region and the second p-type doped region.

16. The semiconductor structure of claim 15, wherein the first gate structure and the second gate structure are electrically floating.

17. A semiconductor structure, comprising:
    a dielectric layer; and
    a fin-shaped structure disposed over the dielectric layer and extending along a direction, the fin-shaped structure comprising:
        a first p-type doped region and a second p-type doped region,
        a first n-type doped region disposed between the first p-type doped region and the second p-type doped region along the direction,
        a second n-type doped region and a third n-type doped region,
        a third p-type doped region disposed between the second n-type doped region and the third n-type doped region along the direction,
    wherein the first p-type doped region, the third p-type doped region and the third n-type doped region are electrically coupled together to a first potential,
    wherein the second p-type doped region, the first n-type doped region and the second n-type doped region are electrically coupled together to a second potential different from the first potential,
    wherein along the direction, a width of each of the first n-type doped region, the second n-type doped region, and the third n-type doped region is greater than a width of each of the first p-type doped region, the second p-type doped region, and the third p-type doped region.

18. The semiconductor structure of claim 10, further comprising:
    a contact etch stop layer (CESL) disposed over the first n-type doped region, the second n-type doped region, the third n-type doped region, the first p-type doped region, the second p-type doped region, and the third p-type doped region; and
    an interlayer dielectric (ILD) layer over the CESL.

19. The semiconductor structure of claim 18, further comprising:
    a first contact feature extending through the CESL and ILD to contact the first p-type doped region;
    a second contact feature extending through the CESL and ILD to contact the first n-type doped region;
    a third contact feature extending through the CESL and ILD to contact the second p-type doped region;
    a fourth contact feature extending through the CESL and ILD to contact the second n-type doped region;
    a fifth contact feature extending through the CESL and ILD to contact the third p-type doped region; and
    a sixth contact feature extending through the CESL and ILD to contact the third n-type doped region.

20. The semiconductor structure of claim 19, wherein the first contact feature, the second contact feature, the third contact feature, the fourth contact feature, the fifth contact feature, and the sixth contact feature comprise tungsten (W), ruthenium (Ru), cobalt (Co), nickel (Ni), or copper (Cu).

* * * * *